(12) United States Patent
Liu et al.

(10) Patent No.: US 9,997,665 B2
(45) Date of Patent: Jun. 12, 2018

(54) MULTIPLE QUANTUM WELL STRUCTURE AND LIGHT EMITTING DIODES

(71) Applicant: XIAMEN SANAN OPTOELECTRONICS TECHNOLOGY CO., LTD., Xiamen (CN)

(72) Inventors: Zhibin Liu, Tianjin (CN); Shasha Chen, Tianjin (CN); Dongyan Zhang, Xiamen (CN); Xiaofeng Liu, Tianjin (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 56 days.

(21) Appl. No.: 15/175,528

(22) Filed: Jun. 7, 2016

(65) Prior Publication Data
US 2016/0293796 A1    Oct. 6, 2016

Related U.S. Application Data

(63) Continuation of application No. PCT/CN2014/094873, filed on Dec. 25, 2014.

(30) Foreign Application Priority Data

Mar. 24, 2014    (CN) .......................... 2014 1 0110224

(51) Int. Cl.
*H01L 33/06* (2010.01)
*H01L 33/04* (2010.01)
*H01L 33/00* (2010.01)
*H01L 33/32* (2010.01)

(52) U.S. Cl.
CPC .......... *H01L 33/06* (2013.01); *H01L 33/0075* (2013.01); *H01L 33/04* (2013.01); *H01L 33/32* (2013.01)

(58) Field of Classification Search
CPC ..... H01L 33/0075; H01L 33/04; H01L 33/32; H01L 33/00
USPC ...................................... 257/13, 88
See application file for complete search history.

(56) References Cited

U.S. PATENT DOCUMENTS

| | | | |
|---|---|---|---|
| 2010/0009484 A1* | 1/2010 | Akita | H01L 21/0254 438/46 |
| 2010/0108985 A1* | 5/2010 | Chung | B82Y 20/00 257/13 |
| 2010/0133508 A1* | 6/2010 | Bergmann | H01L 21/0237 257/13 |
| 2013/0299777 A1* | 11/2013 | Nakamura | H01L 33/16 257/13 |

* cited by examiner

*Primary Examiner* — Tuan Nguyen
(74) *Attorney, Agent, or Firm* — Syncoda LLC; Feng Ma; Junjie Feng

(57) ABSTRACT

A light emitting diode has a light emitting region including a multiple quantum well structure, including a first protection layer, a first intermediate layer over the first protection layer, a quantum barrier layer over the first intermediate layer, a second intermediate layer over the well layer, a second protection layer over the second intermediate layer, and a quantum barrier layer over the second protection layer.

16 Claims, 5 Drawing Sheets

MULTIPLE QUANTUM WELL STRUCTURE AND LIGHT EMITTING DIODES

CROSS-REFERENCE TO RELATED APPLICATIONS

The present application is a continuation of, and claims priority to, PCT/CN2014/094873 filed on Dec. 25, 2014, which claims priority to Chinese Patent Application No. 201410110224.8 filed on Mar. 24, 2014. The disclosures of these applications are hereby incorporated by reference in their entirety.

BACKGROUND

Light-emitting diodes (LEDs), due to their high luminance and energy efficiency, have been recognized as the third generation lighting source and seen rigorous development in recent years. A GaN-based epitaxial wafer grown on a substrate can be a foundation for typical LEDs and determines their performance.

In general, a LED epitaxial wafer comprises a substrate, an N-type conductive layer, a stress releasing layer, a light emitting layer, an electron blocking layer, a P-type conductive layer and a P-type contact layer, wherein, the structure of the light emitting layer and the quality of the crystal are determinant to the photoelectric properties of the semiconductor device. However, in semiconductor devices based on Group-III nitrides, as the quantum well layer mostly differs from the N-type conductive layer and the quantum barrier layer in terms of materials and components, stress will be generated in the quantum well layer, thus generating polarization charges at the interface between the quantum well and the quantum barrier to form a polarization field. This polarization field will cause quantum Stark effect in the quantum well layer that makes electrons and hole wave functions separated, thus reducing photoelectric conversion efficiency and light emitting efficiency.

SUMMARY

The inventors of the present disclosure have recognized that the light emitting efficiency of the quantum well has become a bottleneck for improving the Group-III semiconductor device performance. Therefore, it becomes a research focus to reduce polarization charges and the quantum Stark effect in the quantum well and to improve the light emitting efficiency of devices. In the Chinese patent CN 1552104A, a method for reducing polarization charges in the quantum well has been disclosed, in which, an $In_xGa_{1-x}N/In_yGa_{1-y}N$ superlattice structure is inserted before growth of the quantum well to release the quantum well stress, thus reducing the polarization charges in the quantum well and improving light emitting efficiency. According to CN 102760808A, a light emitting region structure is disclosed, in which, the quantum barrier layer is divided into three layers. The layers at the two sides are made of GaN and the middle layer is made of AlInGaN to release stress in the quantum barrier layer. However, the above technique fails to completely release the quantum well stress. Chinese patent CN 102449737A discloses a method to reduce the polarization charges in the quantum well by growing a Group-III nitride film on a non-polar or semi-polar surface. However, in this method, only few quantum well polarization charges are found in the non-polar plane or the semi-polar plane, with a small polarization field, and the quantum well energy band inclination is reduced; therefore, more In components are required to achieve the same wavelength. As it may be needed to lower the growth temperature in order to improve the efficiency in the In incorporation in the non-polar or semi-polar surface, crystal quality of the quantum well will be adversely impacted. Therefore, the inventors of the present disclosure have recognized a need to further reduce the polarization charges in the quantum well layer.

The present disclosure provides a light emitting diode structure and the fabrication method thereof, in which. A light emitting region based on Group-III nitrides is employed to reduce the polarization charge effect in the quantum well layer.

The light emitting diode structure disclosed in the present invention comprises, from bottom to top, a substrate, a buffer layer, an N-type conductive layer, a stress releasing layer, a light emitting region, an electron blocking layer, a P-type conductive layer and a P-type contact layer. The N-type conductive layer is made of n-type doped Group-III nitrides; and the P-type conductive layer is made of p-type doped Group-III nitrides. The light emitting region has at least one quantum well structure, comprising: a first protection layer based on Group-III nitrides, a first intermediate layer based on Group-III nitrides on the first protection layer, a quantum well layer based on Group-III nitrides on the first intermediate layer, a second intermediate layer based on Group-III nitrides on the quantum well layer, a second protection layer based on Group-III nitrides on the second intermediate layer, and a barrier layer based on Group-III nitrides on the second protection layer.

In the aforesaid quantum well structure, an intermediate layer based on Group-III nitrides grown in variable temperatures is inserted between the well layer and the low-temperature protection layer to effectively reduce the polarization charges in the quantum well structure, reduce quantum Stark effect and improve quantum efficiency. This intermediate layer can also eliminate the additional barrier caused by silicon in the quantum barrier layer, reduce working voltage and improve photoelectric conversion efficiency.

In some embodiments of the present disclosure, the light emitting region of the light emitting diode comprises 2-20 repetitions of the aforesaid quantum well structures, wherein, the growth conditions for each repeated quantum well structure can be the same or different. For example, in 20 pairs of quantum well structures, the periodic thicknesses and growth temperatures of the first 10 pairs can be lower than those of the other 10 pairs.

In some embodiments, the first protection layer is made of $Al_aIn_bGa_{1-a-b}N$ ($0 \leq a \leq 1$, $0 \leq b \leq 1$, $0 \leq a+b \leq 1$), whose forbidden band width should be larger than that of the quantum well materials. The composition of this layer can be set based on that of the well layer to minimize the polarization field of the latter. The thickness is 0-5 nm, and the growth environment is pure $N_2$ or $H_2$ or their combination. The growth temperature is no lower than that of the well layer, and preferably, no higher than the well layer temperature by 100° C.

In some embodiments, the first intermediate layer is made of $Al_pIn_qGa_{1-p-q}N$ ($0 \leq p \leq 1$, $0 \leq q \leq 1$, $0 \leq p+q \leq 1$). The composition will gradually change during growth. The forbidden band width is no larger than that of the first protection layer and no lower than that of the quantum well layer, and presents gradual decrease during growth. The thickness is 0-5 nm, and the growth environment is pure $N_2$ or $H_2$ or their combination. During growth, the temperature is reduced from the growth temperature of the first protection layer to the quantum well layer temperature. Based on component distribution, the corresponding cooling method is adopted, e.g., linear cooling or secondary curve cooling.

In some embodiments, the quantum well layer is made of $Al_xIn_yGa_{1-x-y}N$ (where $0\leq x\leq 1$, $0\leq y\leq 1$, $0\leq x+y\leq 1$), in which, the components can remain unchanged or change. Preferably, the components are remained and the energy band is not changed. The quantum well layer is 0-5 nm thick, and the growth environment is pure $N_2$ or $H_2$ or their combination. The growth temperature is 700-900° C., which can be changed or not during growth. To facilitate control of light emitting wavelength of the device, preferably, the growth temperature of this layer remains constant.

In some embodiments, the second intermediate layer is made of $Al_pIn_qGa_{1-p-q}N$ ($0\leq p\leq 1$, $0\leq q\leq 1$, $0\leq p+q\leq 1$). The component distribution of this layer can be same as or different from that of the first intermediate layer. The forbidden band width is not larger than that of the first protection layer and not less than that of the well layer, and presents gradual increase during growth. The second intermediate layer is 0-5 nm thick, and the growth environment is pure $N_2$ or $H_2$ or their combination. During growth, growth temperature is increased from the growth temperature of the quantum well layer to the second protection layer temperature. Calculate the layer components on the basis of component distribution. Based on component distribution, corresponding heating method is adopted, e.g., linear heating or secondary curve heating.

In some embodiments, the second protection layer is made of $Al_aIn_bGa_{1-a-b}N$ (where $0\leq a\leq 1$, $0\leq b\leq 1$, $0\leq a+b\leq 1$), and the forbidden band width should be larger than that of the quantum well material. The material components of this layer can be set based on material components of the quantum well layer to minimize the polarization field of the quantum well layer. The thickness is 0-5 nm, and the growth environment is pure $N_2$ or $H_2$ or their combination. The growth temperature of this layer is not lower than that of the quantum well layer, and preferably, not higher than the quantum well layer temperature by 100° C. The component distribution, thickness and growth temperature of this layer can be same as or different from those of the first protection layer.

In some embodiments, the barrier layer is made of $Al_cIn_dGa_{1-c-d}N$ (where $0\leq c\leq 1$, $0\leq d\leq 1$, $0\leq c+d\leq 1$), and the forbidden band width should be larger than that of the well layer. The component distribution of the barrier layer materials can be changed or not. The energy band can be changed or not. The thickness is 0-50 nm; the growth temperature should be not lower than the second protection layer temperature and the growth environment can be pure $N_2$ or $H_2$ or their combination; if $H_2/N_2$ mixed gas is used, preferably, the $H_2$ amount should change with different growth temperatures.

In some embodiments, the quantum barrier can be un-doped or be n-type doped when it grows to the layer thickness D (D≥0); in addition, Si-doping is stopped before or when growth is ended, with doping concentration not more than $5\times10^{19}$ cm$^{-3}$. The doping level can be actual doping level or average doping level. In some embodiments, doping starts after growth of 5 nm and stops 5 nm before growth is ended with doping concentration of $2\times10^{18}$ cm$^{-3}$.

In some embodiments, the barrier layer has no Si doped at the well barrier interface to effectively reduce the barrier layer resistance and the additional resistance at the well barrier interface. Moreover, the Si impurities are prevented from being diffused to the quantum well layer to eliminate the pressure stress caused by Si impurities.

DETAILED DESCRIPTION

Detailed descriptions of the present disclosure will be given below with reference to the accompanying drawings and embodiments.

Embodiment 1

Embodiment 1 of the present disclosure will be described in detail with reference to FIGS. 1-2.

Figure 1:
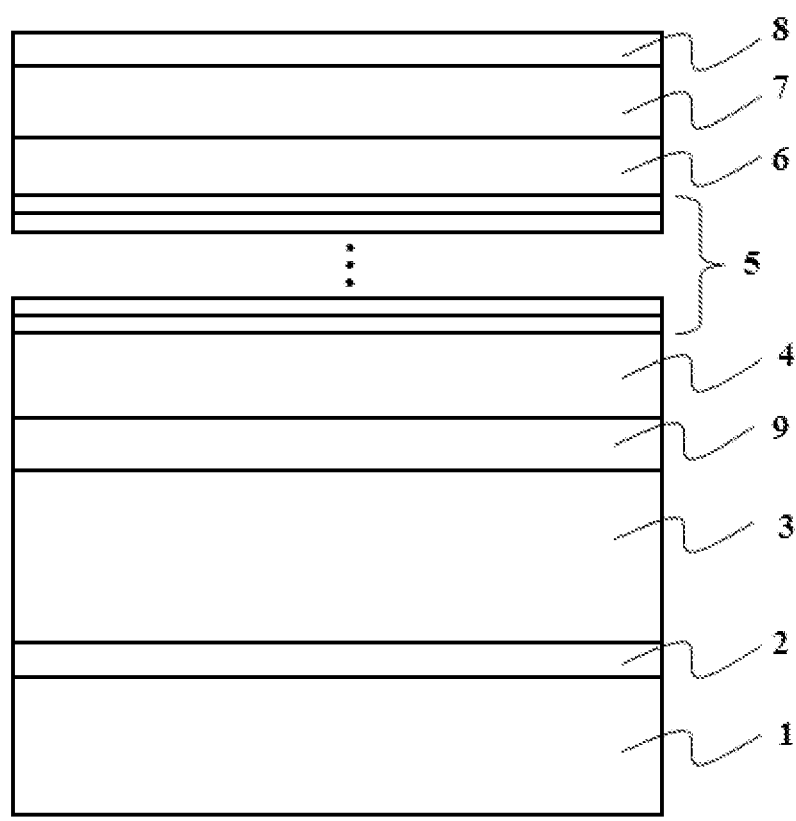
FIG. 1 is a schematic diagram of Embodiment 1.

Referring to FIG. 1, the light emitting diode (LED) structure can comprise a substrate 1, a buffer layer 2, an N-type conductive layer 3, a stress releasing layer 4, a light emitting region 5, an electron blocking layer 6, a P-type conductive layer 7 and a P-type contact layer 8. Specially, the substrate 1 can be sapphire, GaN or Si substrate; the buffer layer 2 is preferably made of GaN, AlN or AlGaN, and can be 30 nm thick; the N-type conductive layer 3 is preferably made of GaN, or AlGaN, and the Si-doping concentration is preferably $2\times10^{19}$ cm$^{-3}$; the stress releasing layer 4 is preferably made of superlattice structures with alternative InGaN/GaN growing at 750° C. and pure $N_2$ environment to increase the V-pits in the light emitting region 5 and release part of stress in the quantum well layer; and a current spreading layer 9 can be inserted between the N-type conductive layer 3 and the stress releasing layer 4, preferably made of AlGaN, in which, electrons pass through the N-type conductive layer 3 for lateral spreading and then flow to the light emitting region for adding light emitting area; the light emitting region 5 has at least one quantum well structure 10, preferably 15 repeated quantum well structures, and its specific structure will be described in detail with reference to FIG. 2; the P-type electron blocking layer 6 is preferably made of AlGaN growing at 750° C.-950° C., and preferably at 800° C.; and its thickness is 50-200 nm, and preferably 150 nm; in this layer, the blocking electrons enter to the P-type layer and combine with holes; gradient Al component growth can be adopted; doping concentrations of the P-type conductive layer 7 and the P-type contact layer 8 are preferably $1\times10$ cm$^{-3}$ and $1\times10^{21}$ cm$^{-3}$ respectively.

Figure 2:
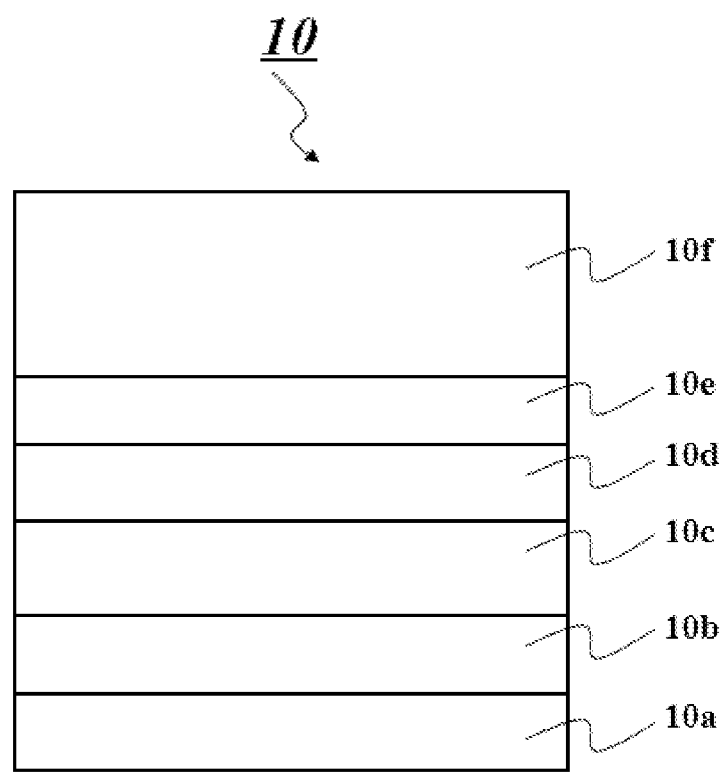
FIG. 2 is an enlarged structure view of the light emitting region 5 according to Embodiment 1.

Referring to FIG. 2, the quantum well structure 10 comprises a first protection layer 10a, a first intermediate layer 10b, a well layer 10c, a second intermediate layer 10d, a second protection layer 10e and a barrier layer 10f.

The first protection layer 10a and the second protection layer 10e are made of $Al_aIn_bGa_{1-a-b}N$ ($0\leq a\leq 1$, $0\leq b\leq 1$, $0\leq a+b\leq 1$) with thickness of 0-5 nm. Preferably, GaN is adopted (i.e., a=b=0); the thickness is 2 nm; and the growth environment is pure $N_2$. The growth temperatures of these two layers should be not lower than that of the quantum well layer, and not higher than the quantum well layer temperature by 100° C. The preferable temperature is 800° C. This layer mainly protects the In components in the quantum well layer and the intermediate layer from being decomposed by high temperature.

The first intermediate layer 10b and the second intermediate layer 10d are made of $Al_pIn_qGa_{1-p-q}N$ ($0 \leq p \leq 1$, $0 \leq q \leq 1$, $0 \leq p+q \leq 1$). The thickness is 0-5 nm, and preferably 2 nm; and the growth environment is pure $N_2$, wherein, the forbidden band width of the first intermediate layer 10b is not larger than that of the first protection layer 10a, and not less than that of the well layer 10c, and presents gradual decrease during growth; and the forbidden band width of the second intermediate layer 10d is not larger than that of the second protection layer 10e, and not less than that of the well layer, and presents gradual increase during growth. Preferably, during growth, the first intermediate layer 10b gradually changes from the energy band distribution of the first protection layer 10a to that of the well layer 10c; and the second intermediate layer 10d changes from the energy band distribution of the well layer 10c to that of the second protection layer 10e. During epitaxial growth, the growth temperature of the first intermediate layer 10b is reduced from the growth temperature of the first protection layer 10a to that of the well layer 10c; and the growth temperature of the second intermediate layer 10d is increased from the growth temperature of the well layer to that of the second protection layer; and any cooling/heating method can be used, e.g., linear cooling/heating. The components of these two layers can be calculated based on the quantum well layer and the energy band distributions of the first and the second protection layers to minimize the polarization charges in the quantum well layer, thus eliminating the polarization field of the quantum well layer, improving light emitting efficiency and reducing droop effect.

The well layer 10c is made of $Al_xIn_yGa_{1-x-y}N$ ($0 \leq x \leq 1$, $0 \leq y \leq 1$, $0 \leq x+y \leq 1$). The thickness is 0-5 nm, and preferably 2 nm; the growth environment is pure $N_2$; the growth temperature is 700° C.-900° C., and preferably, constant at 750° C.

The barrier layer 10f is made of $Al_cIn_dGa_{1-c-d}N$ ($0 \leq c \leq 1$, $0 \leq d \leq 1$, $0 \leq c+d \leq 1$). The thickness is 0-50 nm, and preferably 20 nm; the growth temperature is not lower than that of the second protection layer 10e, and preferably 850° C. The growth environment can be $H_2/N_2$ mixed gas, where $H_2/N_2$ ratio is $0 < H_2/N_2 \leq 1$. Preferably, the $H_2$ amount is 10 L. Introduction of $H_2$ can improve the lattice quality of the quantum barrier layer and reduce dislocation and defects. The barrier layer 10f can be un-doped or be n-type doped when it grows to the layer thickness D ($D \geq 0$); in addition, Si-doping is stopped before or when growth is ended, with doping concentration not more than $5 \times 10^{19}$ $cm^{-3}$. The doping level can be actual doping level or average doping level. In preferable scheme of this embodiment, doping starts after growth of 5 nm and stops 5 nm before growth is ended with doping concentration of $2 \times 10^{18}$ $cm^{-3}$. In this way, the barrier layer resistance and the additional resistance at the well barrier interface are effectively reduced. Moreover, the Si impurities are prevented from being diffused to the quantum well layer to eliminate the pressure stress caused by Si impurities.

Variant 1

Figure 3:
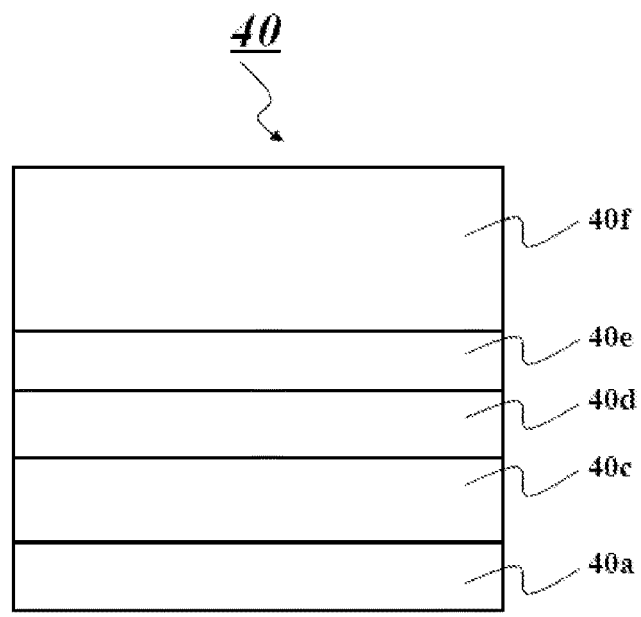
FIG. 3 shows variant 1 of the quantum well structure according to Embodiment 1.

In the light emitting region 5 of the aforesaid light emitting diode, the quantum well 40 structure as shown in FIG. 3 can be used. In this structure, the quantum well 40 comprises: a first protection layer 40a, a well layer 40c, a second intermediate layer 40d, a second protection layer 40e and a barrier layer 40f, i.e., the well layer 40c is directly formed on the first protection layer 40a.

The first protection layer 40a is made of $Al_aIn_bGa_{1-a-b}N$ ($0 \leq a \leq 1$, $0 \leq b \leq 1$, $0 \leq a+b \leq 1$), in which, thickness $D_a$ is $0 < D_a \leq 5$ nm Preferably, GaN is adopted (i.e., a=b=0); the thickness is 1 nm; and the growth environment is pure $N_2$. The growth temperatures of these two layers should be not lower than that of the quantum well layer, and preferably, not higher than the quantum well layer temperature by 100° C. The preferable temperature is 750° C. This layer mainly protects the In components in the quantum well layer and the intermediate layer from being decomposed by high temperature.

The well layer 40c is made of $Al_xIn_yGa_{1-x-y}N$ ($0 \leq x \leq 1$, $0 \leq y \leq 1$, $0 \leq x+y \leq 1$). The thickness $D_c$ is $0 < D_c \leq 5$ nm, and preferably 2 nm; the growth environment is pure $N_2$; the growth temperature is 700° C.-900° C., and preferably, constant at 750° C.

Variant 2

Figure 4:
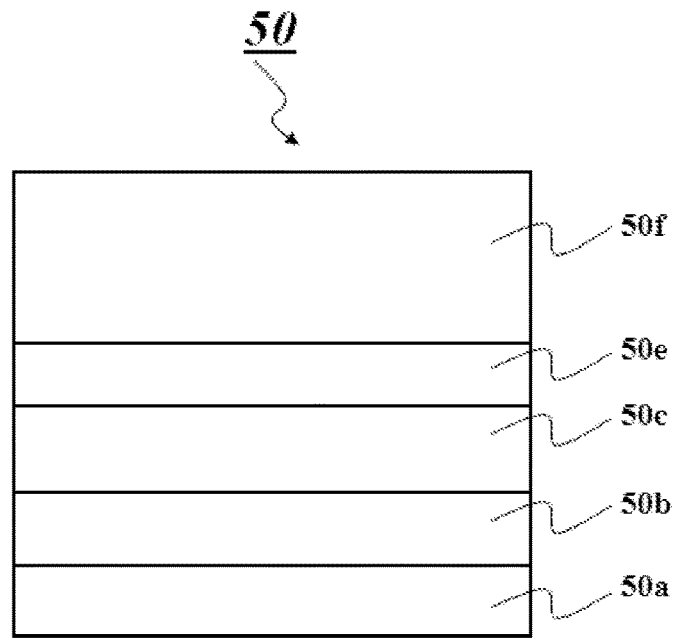
FIG. 4 shows variant 2 of the quantum well structure according to Embodiment 1.

In the light emitting region 5 of the aforesaid light emitting diode, the quantum well 50 structure as shown in FIG. 4 can be used. In this structure, the quantum well 50 comprises a first protection layer 50a, a first intermediate layer 50b, a well layer 50c, a second protection layer 50e and a barrier layer 50f, i.e., the second protection layer 50e is directly formed on the well layer 50c.

The well layer 50c is made of $Al_xIn_yGa_{1-x-y}N$ ($0 \leq x \leq 1$, $0 \leq y \leq 1$, $0 \leq x+y \leq 1$). The thickness $D_c$ is $0 < D_c \leq 5$ nm, and preferably 2 nm; the growth environment is pure $N_2$; the growth temperature is 700° C.-900° C., and preferably, constant at 750° C.

The second protection layer $50_e$ is made of $Al_aIn_bGa_{1-a-b}N$ ($0 \leq a \leq 1$, $0 \leq b \leq 1$, $0 \leq a+b \leq 1$), in which, thickness $D_e$ is $0 < D_e \leq 5$ nm. Preferably, GaN is adopted (i.e., a=b=0); the thickness is 2 nm; and the growth environment is pure $N_2$. The growth temperature of this layer should be not lower than that of the quantum well layer, and preferably, not higher than the quantum well layer temperature by 100° C. The preferable temperature is 750° C. This layer mainly protects the In components in the quantum well layer and the intermediate layer from being decomposed by high temperature.

Variant 3

Figure 5:
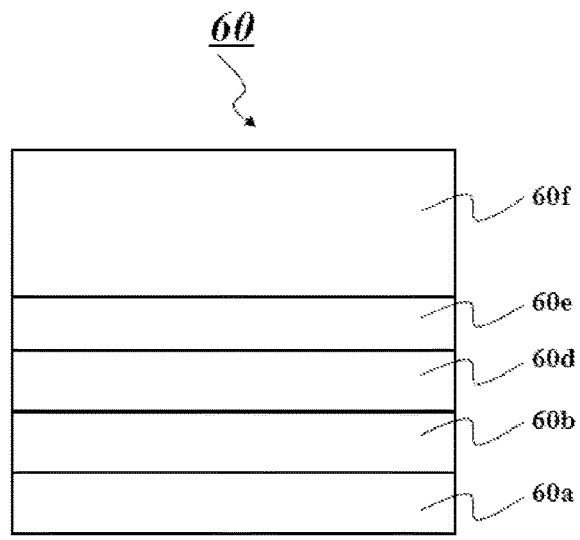
FIG. 5 shows variant 3 of the quantum well structure according to Embodiment 1.

In the light emitting region 5 of the aforesaid light emitting diode, the quantum well 60 structure as shown in FIG. 5 can be used. In this structure, the quantum well 60 comprises: a first protection layer 60a, a first intermediate layer 60b, a second intermediate layer 60d, a second protection layer 60e and a barrier layer 60f, i.e., thickness of the well layer is 0.

The first intermediate layer 60b and the second intermediate layer 60d are made of $Al_pIn_qGa_{1-p-q}N$ ($0 \leq p \leq 1$, $0 \leq q \leq 1$, $0 \leq p+q \leq 1$). The thickness D is $0 < D \leq 5$ nm, and preferably 3 nm; and the growth environment is pure $N_2$, wherein, the forbidden band width of the first intermediate layer 60b is not larger than that of the first protection layer 60a, and presents gradual decrease during growth; and the forbidden band width of the second intermediate layer 60d is not larger than that of the second protection layer 60e, and presents gradual increase during growth. Preferably, during growth, the first intermediate layer 60b gradually changes from the energy band distribution of the first protection layer 60a to the setting distribution, and the second intermediate layer 60d changes from the setting distribution to the energy band distribution of the second protection layer 60e; this setting distribution is determined based on the setting light emitting wavelength. During epitaxial growth, the growth temperature of the first intermediate layer 60b is reduced from the growth temperature of the first protection layer 60a to the setting temperature; and the growth temperature of the second intermediate layer 60d is increased from the setting temperature to the growth temperature of the second protection layer; this setting temperature is determined based on the setting light emitting wavelength; and any cooling/heating method can be used, e.g., linear cooling/heating. The components of these two layers can be calculated based on the setting light emitting wavelength and the energy band distributions of the first and the second protection layers to minimize the polarization charges in the quantum well layer, thus eliminating the polarization field of the quantum well layer, improving light emitting efficiency and reducing droop effect.

Embodiment 2

Figure 6:
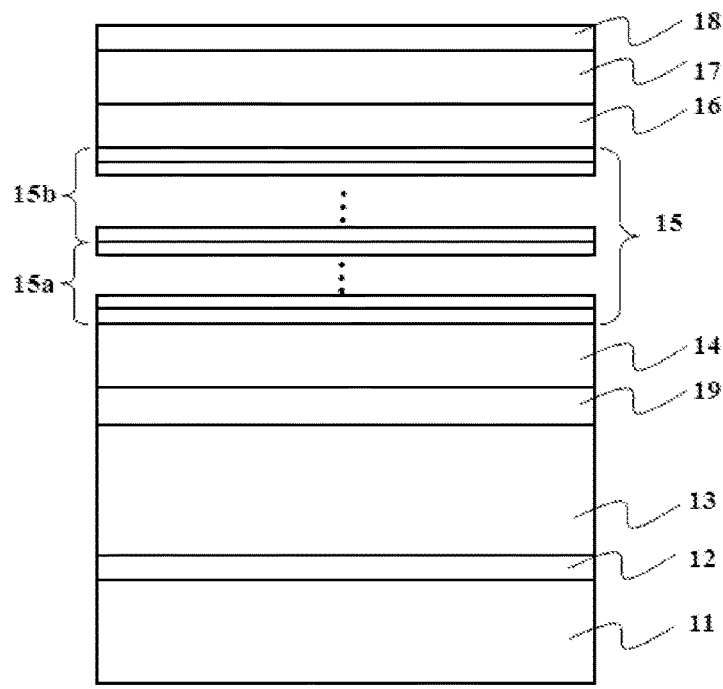
FIG. 6 is a schematic diagram of Embodiment 2.

Embodiment 2 of the present disclosure will be described in detail with reference to FIG. 6. Referring to FIG. 6, the light emitting diode (LED) structure comprises a substrate 11, a buffer layer 12 on the substrate 11, an N-type conductive layer 13 on the buffer layer 12, a stress releasing layer 14 on the N-type conductive layer 13, a light emitting region 15 on the stress releasing layer, wherein, the light emitting region 15 is divided into 15a and 15b. This structure also comprises a P-type electron blocking layer 16 on the light emitting region 15, a P-type conductive layer 17 on the electron blocking layer 16 and a P-type contact layer 18 on the P-type conductive layer 17. In the above structure, except the light emitting region 15, structures and fabrication methods of other layers can be described with reference to Embodiment 1.

Figure 7:
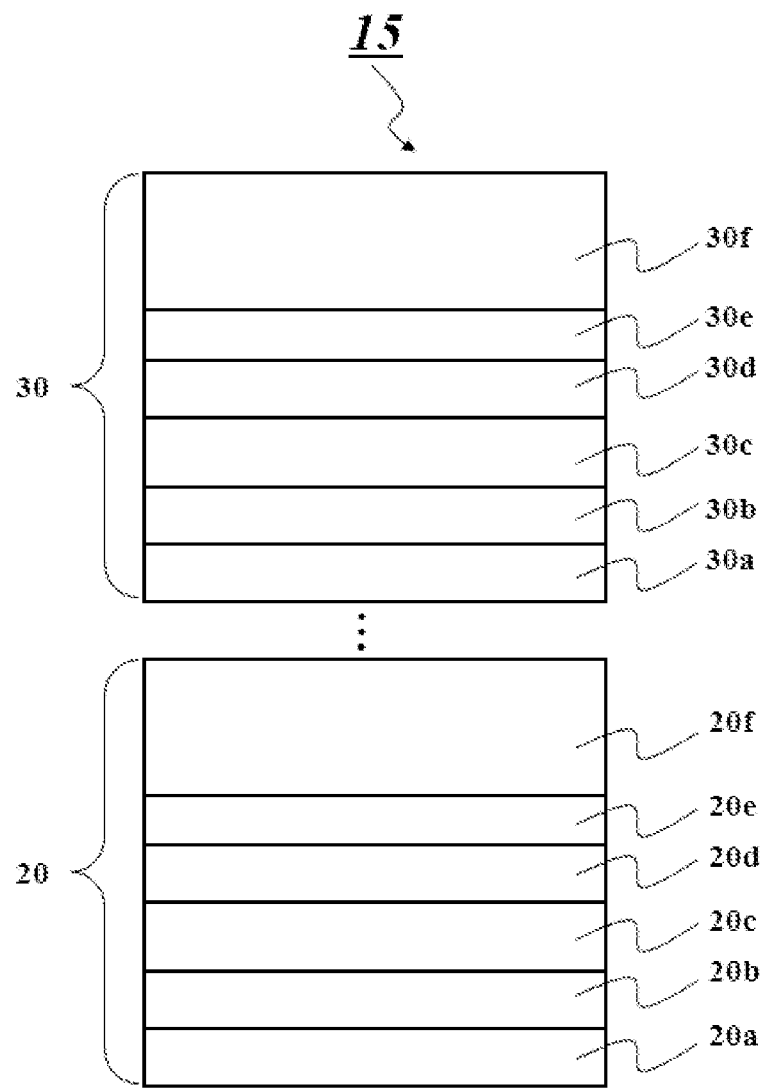
FIG. 7 is an enlarged structure view of the light emitting region 15 according to Embodiment 2.

The first part 15a in the light emitting region 15 has 9 pairs of periodic repeated quantum well structures 20 and quantum well structures 30. Referring to FIG. 7, the quantum well structure 20 in the light emitting region 15 comprises a first protection layer 20a, a first intermediate layer 20b, a well layer 20c, a second intermediate layer 20d, a second protection layer 20e and a barrier layer 20f.

The second part 15b of the light emitting region is on the first part 15a of the light emitting region, having 10 repeated quantum well structures 30. Referring to FIG. 7, the quantum well structure 30 in the light emitting region 15 comprises a first protection layer 30a, a first intermediate layer 30b, a well layer 30c, a second intermediate layer 30d, a second protection layer 30e and a barrier layer 30f. Refer to the growth parameters of each layer in the quantum well structure in Embodiment 1 for the growth parameters of each layer in the quantum well structure 30.

In this embodiment, the growth conditions of the quantum well structure 20 are same as those of the quantum well 30, including growth pressure, air flow, temperature, MO sources and doping sources. However, thickness of each layer in the quantum well structure 20 is not equivalent to that of the corresponding layer in the quantum well structure 30. In the preferable scheme of this embodiment, thickness of each layer in the quantum well structure 20 is ⅓ of the thickness of the corresponding layer in the quantum well structure 30. The main wavelength of the light emitted by the quantum well structure 20 is about 400 nm, and the light emitting efficiency of this structure is far less than that of the quantum well structure 30. The quantum well structure 20 is mainly used for releasing the stress of the quantum well layer in the quantum well structure 30 to eliminate polarization field and improve light emitting efficiency. The thinner is the barrier layer 20f in the quantum well structure 20, the higher is the Si doping concentration of the barrier layer 30f in the quantum well structure 30, and preferable concentration is $1 \times 10^{19}$ cm$^{-3}$.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A Group-III-nitride-based multiple quantum well structure having at least one quantum well, comprising:
   a first protection layer;
   a first intermediate layer over the first protection layer;
   a well layer over the first intermediate layer with a thickness of 0-5 nm;
   a second intermediate layer over the quantum well layer;
   a second protection layer based on Group-III nitrides over the second intermediate layer; and
   a barrier layer over the second protection layer;
   wherein:
   growth temperatures of the first protection layer and the second protection layer are not lower than that of the quantum well layer, and not higher than that of the quantum well layer temperature by 100° C.; and
   a band gap of the first intermediate layer is not larger than that of the first protection layer and not less than that of the well layer, and has a gradual decrease during growth, and a band gap of the second intermediate layer is not larger than that of the second protection layer and not less than that of the well layer, and has a gradual increase during growth.

2. The multiple quantum well structure of claim 1, wherein:
   at least one of the first protection layer or the second protection layer is made of $Al_aIn_bGa_{1-a-b}N$; and
   $0 \leq a \leq 1$, $0 \leq b \leq 1$, $0 \leq a+b \leq 1$.

3. The multiple quantum well structure of claim 1, wherein:
   thicknesses of the first protection layer and the second protection layer are represented with n and m, respectively; and
   $0 < n \leq 5$ nm, $0 < m \leq 5$ nm.

4. The multiple quantum well structure of claim 1, wherein: a band gap of the first protection layer is not less than a band gap of the first intermediate layer material.

5. The multiple quantum well structure of claim 1, wherein: a band gap of the second protection layer is not less than a band gap of the second intermediate layer.

6. The multiple quantum well structure of claim 1, wherein:
   at least one of the first intermediate layer or the second intermediate layer is made of $Al_pIn_qGa_{1-p-q}N$; and
   $0 \leq p \leq 1$, $0 \leq q \leq 1$, $0 \leq p+q \leq 1$.

7. The multiple quantum well structure of claim 1, wherein:

thicknesses of the first intermediate layer and the second intermediate layer are represented with i and j, respectively;

$0 \leq i \leq 5$ nm, $0 \leq j \leq 5$ nm; and i and j are not 0 at a same time.

8. The multiple quantum well structure of claim 1, wherein: during growth of the first intermediate layer, a growth temperature is reduced from a growth temperature of the first protection layer to a growth temperature of the well layer through a monotonic decrease.

9. The multiple quantum well structure of claim 1, wherein: during growth of the second intermediate layer, a growth temperature is increased from a growth temperature of the well layer to a growth temperature of the second protection layer through a monotonic increase.

10. The multiple quantum well structure of claim 1, wherein: the well layer is made of $Al_xIn_yGa_{1-x-y}N$, and $0 \leq x \leq 1$, $0 \leq y \leq 1$, $0 \leq x+y \leq 1$.

11. The multiple quantum well structure of claim 1, wherein: the barrier layer is made of $Al_cIn_dGa_{1-c-d}N$, and $0 \leq c \leq 1$, $0 \leq d \leq 1$, $0 \leq c+d \leq 1$.

12. The multiple-quantum well structure of claim 1, wherein: the barrier layer has a thickness of 0-50 nm.

13. The multiple quantum well structure of claim 1, wherein: the barrier layer is fully doped or partially doped with a doping concentration not more than $5 \times 10^{19}$ cm$^{-3}$.

14. A light-emitting diode (LED), comprising:
an N-type conductive layer;
a P-type conductive layer; and
a light emitting layer between the N-type conductive layer and the P-type conductive layer, wherein the light emitting layer includes:
a Group-III-nitride-based multiple quantum well structure having at least one quantum well, comprising:
a first protection layer;
a first intermediate layer over the first protection layer;
a well layer over the first intermediate layer with a thickness of 0-5 nm;
a second intermediate layer over the quantum well layer;
a second protection layer based on Group-III nitrides over the second intermediate layer; and
a barrier layer over the second protection layer;
wherein:
growth temperatures of the first protection layer and the second protection layer are not lower than that of the quantum well layer, and not higher than that of the quantum well layer temperature by 100° C.; and
a band gap of the first intermediate layer is not larger than that of the first protection layer and not less than that of the well layer, and has a gradual decrease during growth, and a band gap of the second intermediate layer is not larger than that of the second protection layer and not less than that of the well layer, and has a gradual increase during growth.

15. The LED of claim 14, wherein:
at least one of the first protection layer or the second protection layer is made of $Al_aIn_bGa_{1-a-b}N$; and
$0 \leq a \leq 1$, $0 \leq b \leq 1$, $0 \leq a+b \leq 1$.

16. A method of growing a Group-III-nitride-based multiple quantum well structure having at least one quantum well, the structure comprising:
a first protection layer;
a first intermediate layer over the first protection layer;
a well layer over the first intermediate layer;
a second intermediate layer over the quantum wall layer;
a second protection layer based on Group-ill nitrides over the second intermediate layer; and
a barrier layer over the second protection layer, wherein the method comprises:
growing the first protection layer at a first temperature;
growing the first intermediate layer at monotonically decreasing temperatures from the first temperature to a second temperature; and
growing the well layer at the second temperature;
wherein, growing the second intermediate layer with monotonically increasing temperatures form the second temperature to a third temperature; and growing the second protection layer at the third temperature; wherein: a band gap of the first intermediate layer is not larger than band gap of the first protection layer and not less than a band gap of the well layer, the method further comprising gradually decreasing the band gap of the first intermediate layer during growth; and a band gap of the second intermediate layer is not larger than a band gap of the second protection layer and not less than a band gap of the well layer, the method further comprising gradually increasing the hand gap of the second intermediate layer during growth.

* * * * *